(12) United States Patent
Sridhara et al.

(10) Patent No.: US 10,574,270 B1
(45) Date of Patent: Feb. 25, 2020

(54) SECTOR MANAGEMENT IN DRIVES HAVING MULTIPLE MODULATION CODING

(71) Applicant: Seagate Technology LLC, Cupertino, CA (US)

(72) Inventors: Deepak Sridhara, Longmont, CO (US); Ara Patapoutian, Hopkinton, MA (US); Prafulla B Reddy, Longmont, CO (US); Richard Jay Parshall, Shrewsbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 422 days.

(21) Appl. No.: 15/347,743

(22) Filed: Nov. 9, 2016

(51) Int. Cl.
*H03M 13/29* (2006.01)
*G06F 3/06* (2006.01)
*G06F 12/109* (2016.01)

(52) U.S. Cl.
CPC ........ *H03M 13/2906* (2013.01); *G06F 3/064* (2013.01); *G06F 3/0619* (2013.01); *G06F 3/0673* (2013.01); *G06F 12/109* (2013.01); *G06F 2212/1008* (2013.01); *G06F 2212/657* (2013.01)

(58) Field of Classification Search
CPC ............. H03M 13/2906; H03M 13/35; H03M 13/353; H03M 13/356; G06F 12/109; G06F 3/0619; G06F 3/0638; G06F 3/064; G06F 3/0646; G06F 3/0673; G06F 2212/657; G06F 2212/1008; G06F 11/08; G06F 11/1666; H04L 1/0002; H04L 1/0003; H04L 1/0005; H04L 1/0006; H04L 1/0007; H04L 1/0008; H04L 1/0016; H04L 1/0028; H04L 1/003
See application file for complete search history.

(56) References Cited

U.S. PATENT DOCUMENTS

| | | |
|---|---|---|
| 6,574,699 B1 | 6/2003 | Dobbek |
| 8,472,295 B1 | 6/2013 | Jin |
| 8,937,778 B1 | 1/2015 | Vamica |
| 8,976,474 B1 | 3/2015 | Wang |
| 9,229,813 B2 | 1/2016 | Chatradhi |
| 2005/0223154 A1* | 10/2005 | Uemura .............. G06F 12/0223 711/4 |
| 2010/0232049 A1* | 9/2010 | Kompella ............. G06F 3/0608 360/55 |

(Continued)

*Primary Examiner* — Kyle Vallecillo
(74) *Attorney, Agent, or Firm* — Setter Roche LLP; Christian W. Best

(57) ABSTRACT

Systems and methods are disclosed for implementing sector management in drives having multiple modulation coding. A circuit may be configured to generate a data sector having a first number of bits based on a first modulation encoding scheme associated with a first location of a data storage medium, determine a difference between the first number of bits and a second number of bits corresponding to a second modulation encoding scheme associated with a second location of the data storage medium, append a number of padding bits to the data sector based on the difference, and store the data sector to the second location of the data storage medium. The data sector may be a sector reallocated from the first location to the second location. The data sector may also be an intermediate parity sector stored to a media cache region of the data storage device.

20 Claims, 9 Drawing Sheets

(56) References Cited

U.S. PATENT DOCUMENTS

| | | | |
|---|---|---|---|
| 2014/0115427 A1* | 4/2014 | Lu | G06F 11/1048 |
| | | | 714/773 |
| 2014/0208062 A1* | 7/2014 | Cohen | G06F 3/0608 |
| | | | 711/206 |
| 2016/0148625 A1 | 5/2016 | Zhu | |
| 2019/0268019 A1* | 8/2019 | Myung | H03M 13/611 |

* cited by examiner

SECTOR MANAGEMENT IN DRIVES HAVING MULTIPLE MODULATION CODING

SUMMARY

In certain embodiments, a circuit may be configured to generate a first data sector having a first number of bits based on a first encoding scheme associated with a first location of a data storage medium. The circuit may determine a difference between the first number of bits and a second number of bits corresponding to a second encoding scheme associated with a second location of the data storage medium, and append a number of padding bits to the first data sector based on the difference. The circuit may store the first data sector to the second location of the data storage medium.

In certain embodiments, a method may comprise generating a first data sector having a first number of bits based on a first encoding scheme associated with a first location of a data storage medium, the first encoding scheme is a first modulation code which produces sectors having the first number of bits. The method may include determining a difference between the first number of bits and a second number of bits corresponding to a second encoding scheme associated with a second location of the data storage medium, appending a number of padding bits to the first data sector based on the difference, and storing the first data sector to the second location of the data storage medium.

In certain embodiments, an apparatus may comprise a channel circuit configured to generate a first data sector having a first number of bits based on a first encoding scheme associated with a first location of a data storage medium. The channel circuit may determine a difference between the first number of bits and a second number of bits corresponding to a second encoding scheme associated with a second location of the data storage medium, append a number of padding bits to the first data sector based on the difference, and store the first data sector to the second location of the data storage medium.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
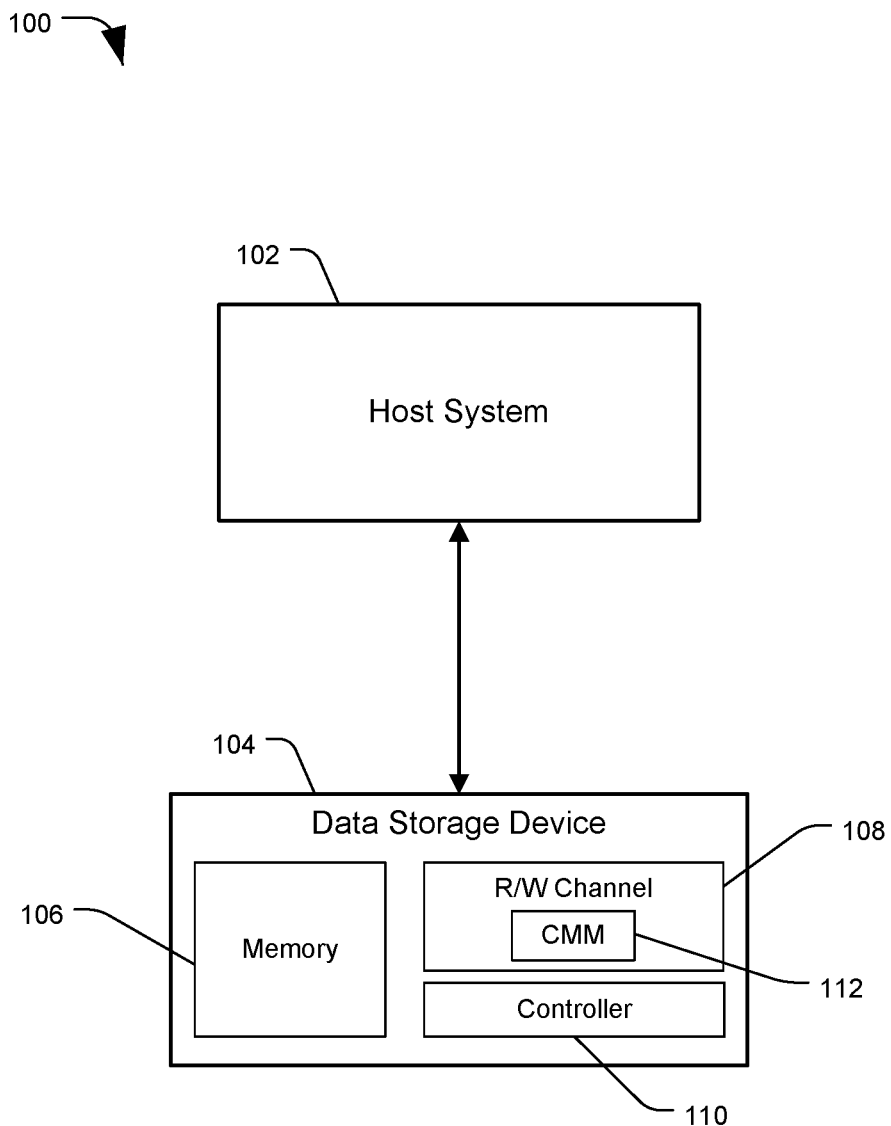
FIG. 1 is a diagram of a system configured to implement sector management in drives having multiple modulation coding, in accordance with certain embodiments of the present disclosure.

FIG. 1 is a diagram of a system, generally designated 100, configured to implement sector management in drives having multiple modulation coding, in accordance with certain embodiments of the present disclosure. The system 100 may include a data storage device (DSD) 104, such as a storage drive (e.g. a hard disc drive (HDD) or hybrid drive) or any other device which may be used to store or retrieve data. The system 100 may optionally include a host device 102, which may also be referred to as the host system or host computer. The host 102 can be a desktop computer, a laptop computer, a workstation, a tablet computer, a telephone, a music player, another electronic device, or any combination thereof. The host 102 and DSD 104 may be connected by way of a wired or wireless connection, or by a local area network (LAN) or wide area network (WAN). The DSD 104 can be a stand-alone device not connected to a host 102 (e.g. a removable or external data storage device having its own case or housing), or the host 102 and DSD 104 may both be part of a single unit (e.g. a computer having an internal hard drive). The host 102 may issue data access requests, such as read or write requests, to the DSD 104. In response, the DSD 104 may perform data access operations based on the requests.

The DSD 104 may include a memory 106, a read/write (R/W) channel 108, and a controller 110. The memory 106 may comprise one or more data storage mediums, such as magnetic storage media like hard discs, solid state memory like Flash, other types of memory, or a combination thereof. The R/W channel 108 may be a digital communications channel comprising one or more circuits or processors configured to process signals for recording data to or reading data from the memory 106. The controller 110 may be a processor or circuit configured to perform data access operations, such as reads or writes, to the memory 106. Data retrieved from the memory 106, or to be stored to the memory 106, may be processed via the R/W channel 108, such as by encoding or decoding signals, detecting values from signal waveforms, or other processing.

When data is to be stored to the memory 106, it may be encoded using a number of different encoding schemes. Encoding may include modifying the data into another form, for example by passing the data bits through a convolution algorithm that will output a new sequence of bits. For example, data may be encoded using modulation encoding, error correction code (ECC) encoding, or other types of encoding. Encoding data may produce a different number of bits as an output than were used as an input. For example, a 512-byte host data block may be encoded using a modulation encoding scheme to produce a 520-byte modulation-encoded data block.

Modulation codes may shape the data in such a way as to reduce the bit error rate (BER) when reading the data back. For example, the DSD 104 may use sequence-based detection (such as BCJR algorithms) to identify data bits from a signal waveform detected from a magnetic disc. Modulation encoding, such as using RLL (run length limited), Markov, or RDS (running digital sum) encoding, may remove or modify sequence patterns that are difficult to detect.

ECCs may be a form of encoding that produces parity bits which, together with detected host or user data bits, can be used to correct errors, such as sectors or bits that were not successfully read. ECCs may include inner code (IC) encoding and outer code (OC) encoding. IC encoding, such as a low-density parity check (LDPC) code, may produce parity bits for each host sector, which parity bits can be stored with the sector. If some bits of a sector fail to read, the IC parity bits may be used to recover those bits (up to an error correction capability of the algorithm used or number of parity bits produced). OC encoding may generate parity bits or sectors based on all sectors in an OC parity block, such as a track of a disc memory. By reading all the sectors from the parity block, including the generated parity sectors, then a number of failed sectors may be recovered based on the error correction capability of the OC encoding scheme. Some DSDs may be configured to perform iterative outer code (IOC) error correction, which may enable the DSD to iterate between IC correction and OC correction, improving the error correction capability of the DSD.

Some error correction techniques may require that data be encoded in the proper format or with the correct encoding scheme to properly function. For example, performing OC or IOC correction may depend on all of the sectors of the OC parity block being encoded with the proper encoding scheme. However, some DSDs may use multiple coding schemes, with a different scheme being used for different areas or zones of a memory 106. A zone may be a large group of contiguous tracks, such that a hard disc may be divided into a plurality concentric zones, each zone having a plurality of tracks. Tracks within a zone may have sectors of approximately the same size (e.g. data capacity and physical sector size on the storage media). Due to different encoding schemes producing sectors of a different size (e.g. a different number of bits per sector), utilizing different encoding schemes in different zones may mean that the sector sizes between zones are different, even if the host sector sizes (number of bits per sector from a host) remains consistent. For example, a drive may use different modulation encoding schemes for different zones, so that each zone has sectors of a different size. A first modulation code may be unable to decode data encoded with a second, different modulation code, and vice versa. A sector associated with a first area having a first encoding scheme may at times be stored to a second area having a second encoding scheme. This may result in problems with either inconsistent sector sizes, inconsistent encoding schemes for error correction, or both.

Accordingly, in order to maintain proper functionality of data storage and encoding operations, the DSD may include a coding management module (CMM) 112, which may be included in the R/W channel 108, the controller 110, distributed among various components, or otherwise included in the DSD 106. The CMM 112 may manage the coding schemes applied when encoding data for recording to the memory 106, or decoding data read from the memory 106. The CMM 112 may also control operations such as padding extra bits on data sectors stored to an area with which the sector is not associated, and maintaining information on a number of padding bits for such sectors. Padding may include appending dummy or meaningless data onto valid data to make the total data sector a desired length. An example embodiment of system 100, including a more detailed diagram of DSD 104, is depicted in FIG. 2.

Figure 2:
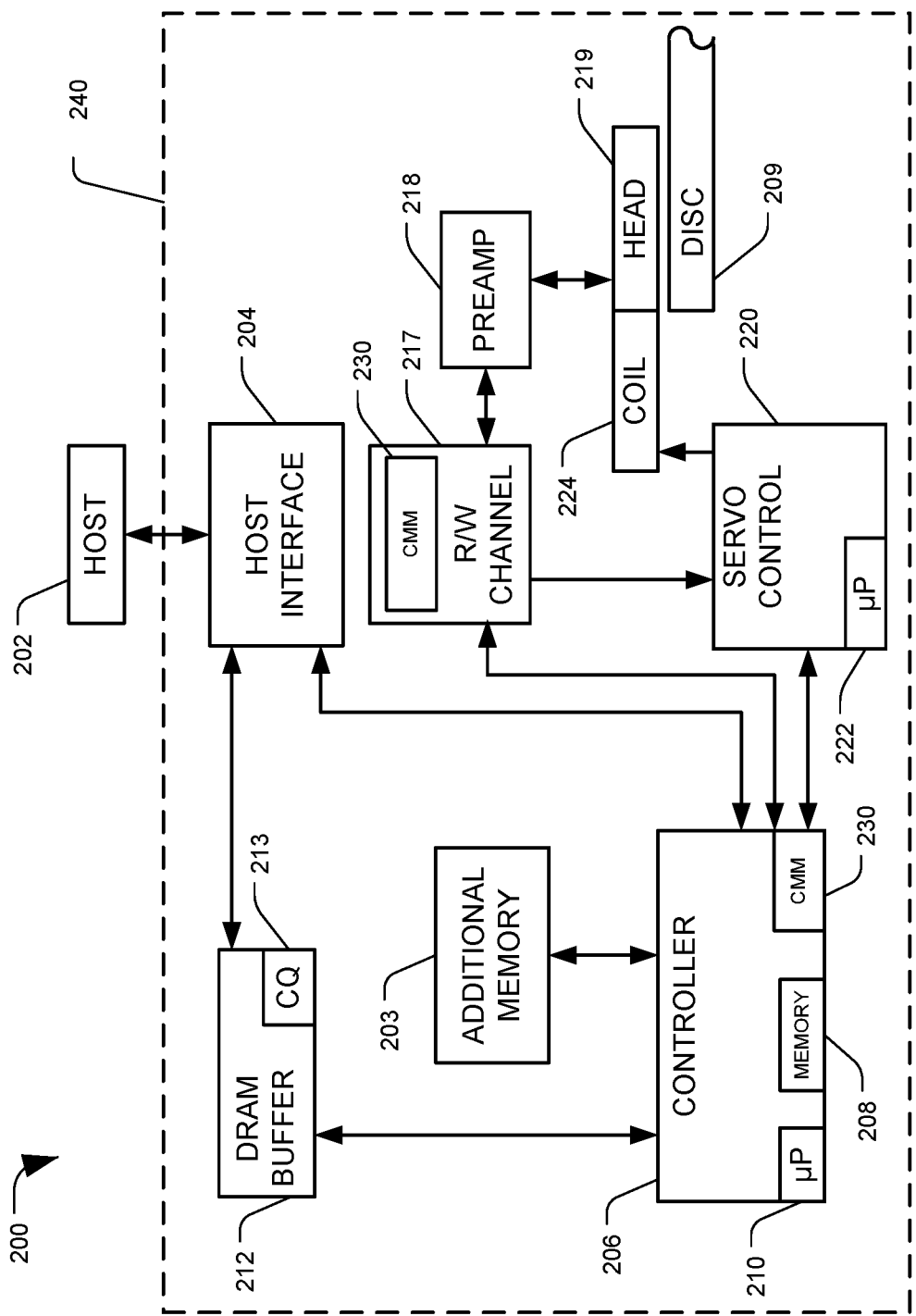
FIG. 2 is a diagram of a system configured to implement sector management in drives having multiple modulation coding, in accordance with certain embodiments of the present disclosure.

FIG. 2 is a diagram of a system 200 configured to implement sector management in drives having multiple modulation coding, in accordance with certain embodiments of the present disclosure. Specifically, FIG. 2 provides a functional block diagram of an example data storage device (DSD) 200.

The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector (not shown) that allows the DSD 200 to be physically removed from the host 202. The DSD 200 may have a casing 240 housing the components of the DSD 200. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. The controller 206 may control data access operations, such as reads and writes, to one or more disc memories 209, or to additional memories 203. The DSD 200 may include the additional memory 203 instead of or in addition to disc memory 209. For example, additional memory 203 can be a solid state memory, which can be either volatile memory such as DRAM or SRAM, or non-volatile memory, such as NAND Flash memory. The additional memory 203 can function as a cache and store recently or frequently read or written data, data likely to be read soon, or temporary data such as intermediate super parity (ISP) sectors calculated for random write data before an entire OC parity block (e.g. a full track) can be read and the OC parity sectors updated. ISP sectors may sometimes be referred to as intermediate or temporary parity sectors. ISP sectors may be temporary in that they may be used until a standard OC parity sector can be generated for the entire OC parity block, and are not stored along with the other sectors of the OC parity block. Additional memory 203 may also function as main storage instead of or in addition to disc(s) 209. A DSD 200 containing multiple types of nonvolatile storage mediums, such as a disc(s) 209 and Flash 203, may be referred to as a hybrid storage device.

The DSD 200 can include a read-write (R/W) channel 217, which can encode data during write operations and decode and reconstruct user data retrieved from a memory, such as disc(s) 209, during read operations. A preamplifier circuit (preamp) 218 can apply write currents to the head(s) 219 and provides pre-amplification of read-back signals. The preamp 218 and head(s) 219 may be considered part of the R/W channel 217. A servo control circuit 220 may use servo data to provide the appropriate current to the coil 224, sometimes called a voice coil motor (VCM), to position the head(s) 219 over a desired area of the disc(s) 209. The controller 206 can communicate with a processor 222 to move the head(s) 219 to the desired locations on the disc(s) 209 during execution of various pending commands in the command queue 213.

DSD 200 may include a coding management module (CMM) 230. The CMM 112 may manage the coding schemes applied when encoding data for recording to the memory 106, or decoding data read from the memory 106. Encoding and decoding operations controlled by the CMM 230 is discussed in more detail in regard to FIG. 3.

Figure 3:
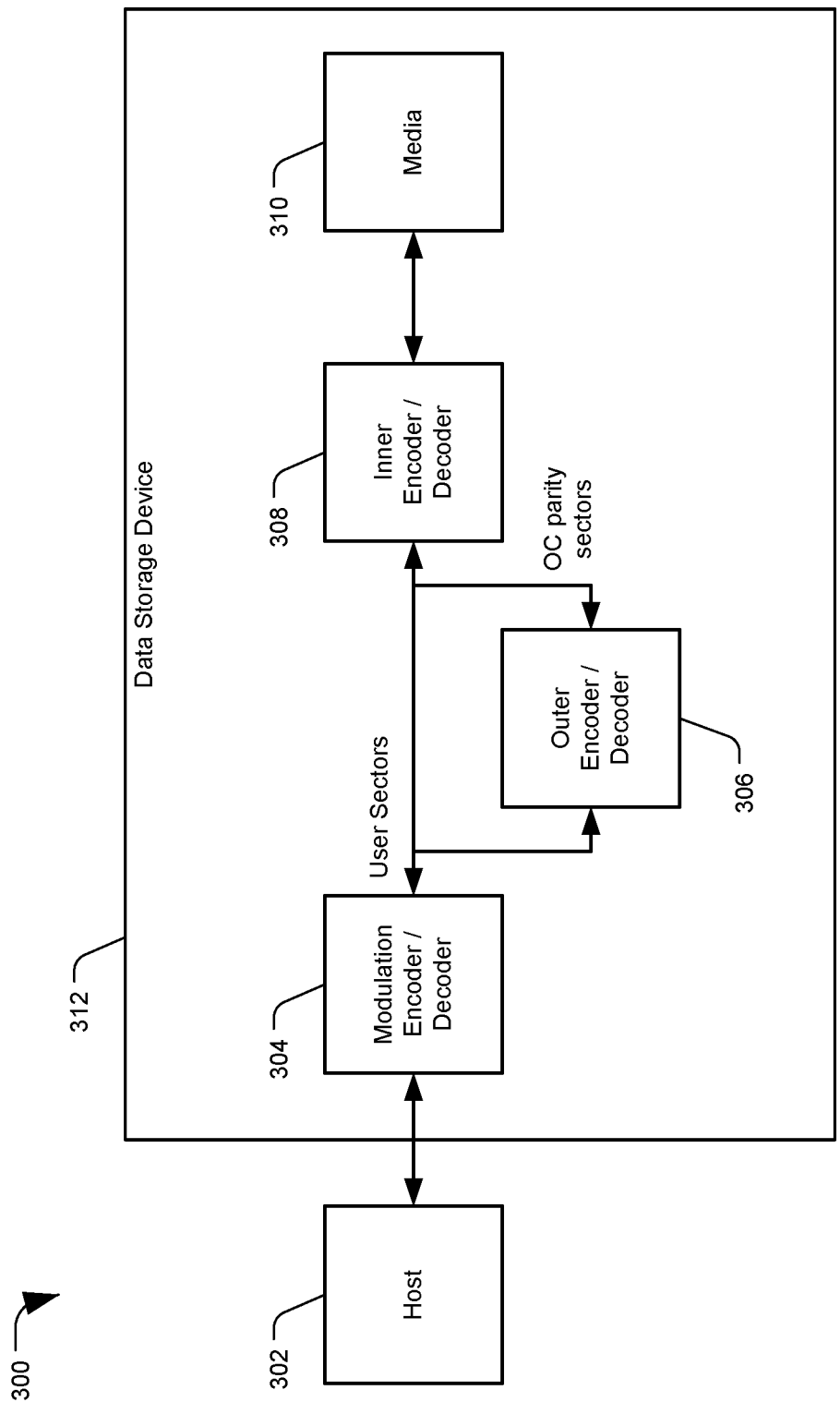
FIG. 3 is a diagram of a system configured to implement sector management in drives having multiple modulation coding, in accordance with certain embodiments of the present disclosure.

FIG. 3 is a diagram of a system configured to implement sector management in drives having multiple modulation coding, in accordance with certain embodiments of the present disclosure. In particular, FIG. 3 depicts blocks or modules along a data path 300 between a host device 302 and a data storage media 310, such as a hard disc magnetic storage medium.

The data path 300 may include components of a data channel in a data storage device (DSD) 312, such as an R/W channel of a hard disc drive (HDD). In particular, a data channel may include one or more data encoding and decoding modules, where each module may perform a given type of encoding and decoding. The data path 300 may include a modulation encoder/decoder 304, an outer code (OC) encoder/decoder 306, and an inner code (IC) encoder/decoder 308. The encoders/decoders themselves may be included in the code management module (CMM) 230 of FIG. 2, or the CMM may control the operation of the encoders/decoders (e.g. the CMM comprises a control circuit executing encoding and decoding firmware instructions to direct the encoders/decoders).

A data write operation may include receiving a write request and associated host data from the host 302 at the DSD 312. The host 302 may specify a logical block address (LBA) range to which the data is to be stored. LBAs received from the host 302 may be associated with specific physical sectors or addresses of the storage media 310, or associated with a particular zone of the media 310. The write request may include writing one or more full data tracks of the media 310, or a subset of the sectors on a track.

When a write request is received, the DSD 312 may identify a selected target storage location associated with the write request, for example by using an address table to identify physical sectors based on the LBAs. The target location for data may be based on an original location associated with an LBA (e.g. without consideration of reallocated sectors changing where data for an LBA is stored) or based on the location of an outer code (OC) parity block associated with the data. As discussed herein, the DSD 312 may employ multiple types of modulation coding schemes, and may associate a particular modulation code with specific zones or tracks of the media 310. When a target storage location of the write request is identified, the DSD 312 may also identify the associated modulation coding scheme for that location. The write data and an indication of the modulation coding scheme may be provided to the modulation encoder/decoder 304. The modulation encoder/decoder 304 may determine the modulation coding algorithm to apply based on the modulation coding scheme indicator, such as by using a lookup table (LUT). For example, the DSD 312 may use three different modulation coding schemes, and may have associated algorithms stored to a table by values 1, 2, and 3. The different modulation coding schemes may be different algorithms of the same type of modulation encoding (e.g. RLL codes or Markov codes), or completely different types of modulation codes. Alternately, rather than receiving an indication of the modulation coding scheme to apply, the modulation encoder/decoder 304 may determine which modulation code to apply based on the received LBAs.

Once the appropriate algorithm is identified, the modulation encoder/decoder 304 may encode the host data using the selected modulation code. In some embodiments, the DSD 312 may have a separate modulation encoder/decoder 304 hardcoded to perform each modulation encoding scheme, and the appropriate encoder/decoder may be selected to encode the host data once the target location and associated modulation code is identified. The DSD 312 may similarly have separate encoders, or programmable encoders configured to execute multiple coding schemes, for other types of encoding as well, such as IC and OC encoding.

The modulation-encoded sectors may be passed to both an IC encoder/decoder 308 and an OC encoder/decoder 306. The IC encoder/decoder may apply an IC code to the data for each sector to produce IC parity bits, which may be added to the sector. During a read, the IC parity data may be used to correct bits within a sector that fail to read properly. Meanwhile, the OC encoder/decoder 306 may accumulate the modulation-encoded data from multiple sectors (e.g. an OC parity block worth of sectors, such as a full track of sectors being written), and then apply an OC code to the collected sectors to generate OC parity sectors based on all of the collected sectors. For example, the OC encoder/decoder 306 may generate two OC parity sectors for a full track of data, and the OC parity sectors may be stored to the corresponding track. The OC parity sectors may be used to correct or reconstruct sectors that failed to decode (e.g. IC decoding fails when reading the sector back) by attempting to read all sectors on the corresponding track. The OC parity sectors may also be provided to the IC encoder/decoder 308, which may append IC parity bits to the OC parity sector. Once a sector (either a data sector or OC parity sector) has been encoded by the IC encoder/decoder 308, the sector may be written to the target storage location on the media 310.

When reading data back from the media 310, the data may be read by a read head and decoded by the IC encoder/decoder 308, which may also correct a number of incorrect bits based on an error correction capability of the IC code. The decoded data sectors may be provided to the OC encoder/decoder for OC error correction in case one or more sectors fail to decode. Performing OC error correction may include reading the data from each sector in an OC parity block. When a sector is successfully read, OC syndrome information for that sector is collected and added to a syndrome state or syndrome block, while failed sectors may not be added to the syndrome state. A syndrome state may include a value derived from the sectors in an OC block, such as via an XOR operation. The syndrome state may be used to reconstruct one or more failed sectors during OC error correction. Sectors that are successfully decoded or recovered may be provided to the modulation encoder/decoder 304 for modulation decoding, and the decoded data sectors may be provided to the host 302 in response to a host read request.

In addition to attempting IC error correction and OC error correction, a DSD may also employ iterative outer code (IOC) error correction. IOC error correction may include iterating between IC and OC error correction to progressively recover failed bits and sectors. An embodiment of iterative outer code correction is described in U.S. Pat. No. 9,015,549, titled "Iterating Inner and Outer Codes for Data Recovery", the contents of which are hereby incorporated by reference in their entirety. When performing OC recovery is discussed herein, IOC recovery may also be performed.

OC error correction (and therefore IOC correction) during a read may require that all the sectors in the OC parity block, including both the host sectors and OC parity sectors, are of a uniform size and are received by the OC encoder/decoder 306 in the same form as when the OC encoding was performed. Any encoding that would cause some sectors from the OC parity block to have a different size (e.g. number of bits) than other sectors in the OC parity block may prevent or interfere with OC error correction. In addition to maintaining sector length, the OC parity sectors that are computed on the original track must remain valid, and hence all sectors of the OC parity block should have the same data when being OC decoded as when they were OC encoded. Therefore any encoding that would change the data content of sectors from an OC block may interfere with OC error correction.

When the sectors of the OC parity block are stored on the same data track, the size and form constraints may not be an issue, as the sectors may all undergo the same type of encoding. However, at times one or more sectors of an OC parity block, such as a user sector or parity sector, may be stored to a different location from the other sectors. For example, a sector may be relocated to a spare sector in a different area due to a defect on the media, or a temporary or intermediate super parity (ISP) sector may be generated and stored to a media cache region of the media 310 rather than with the host sectors with which it is associated. If the different location is associated with a different modulation code, the sectors may end up having different sizes and interfere with proper OC error correction. Alternately, if a data sector is moved to a different storage area, it may end up being the wrong size for the media sectors of the different location to which it is stored due to the different modulation encoding schemes, introducing difficulties in data storage and detection.

The modulation encoding scheme applied to a host sector during a write operation may determine a length of the modulation-encoded host data, and hence the media sector size. For example, when provided with a 512-byte host data sector, a first modulation code may produce a 520-byte modulation-encoded media sector, while a second modulation code may produce a 540-byte modulation-encoded media sector. Accordingly, the sector sizes on the media 310 may be different between zones having different associated modulation encoding schemes, even though the host sector sizes remain constant. If sectors from the same OC parity block are encoded with different modulation codes, it may interfere with OC error correction due to the different modulation-encoded sector sizes.

A DSD may be configured so that modulation encoding is performed after OC encoding, which can ensure that the sectors are OC encoded before their lengths diverge. When sectors are read back and provided to the OC decoder 306 they may have already been IC decoded and modulation decoded, returning the sectors to the state they were in before undergoing different modulation coding schemes. However, performing IOC may involve iterative decoding between a detector of a read channel and the IC encoder/decoder 308, and iterating between IC and OC error correction. Modulation code may be nonlinear code, which may cause error propagation when performed during iterative decoding. Therefore, locating the modulation encoder/decoder 304 between the OC encoder/decoder 306 and IC encoder/decoder 308, or between the IC encoder/decoder 308 and the detector, may interfere with IOC execution. Hence, it may be advantageous to perform modulation encoding prior to OC encoding, to avoid error propagation during iterative inner-outer-decoding.

To ensure that sectors from the same parity block are of a uniform size in a system configured to perform IOC error correction, the DSD may implement a process as described herein. Broadly speaking, sectors may be generated having a length corresponding to a target location for the OC block. Once OC parity sectors are generated for the uniform-size sectors, sectors that will be stored to a different location may then be padded with extra bits so as to appropriately fit the media sectors of the different location. During reads and error recovery, the extra bits may be removed in order to perform OC and IOC recovery operations. More detailed descriptions are provided below.

A host may have a storage medium having a first storage location associated with a first modulation encoding scheme, and a second storage location associated with a second modulation encoding scheme. The first and second modulation encoding schemes may be different, and therefore may produce modulation-encoded sectors having different sizes. Data intended to be stored to the first storage location (e.g. having an LBA originally located in the first storage location) may be encoded with the first modulation encoding scheme and not padded. Data intended to be stored to the second storage location may be encoded with the second modulation encoding scheme and not padded. However, data intended or associated with the first storage location, but that will ultimately be stored to the second storage location, may be encoded with the first modulation encoding scheme and padded to correspond to the sector size of the second storage location.

When a host sector is to be written, the sector may be associated with a selected modulation encoding scheme corresponding to a first location or zone of the media 310. For example, the first location may be a target location of the host write request (e.g. target track A). All host sectors associated with the selected modulation encoding scheme may be encoded with the selected modulation encoding scheme, regardless of where a sector is ultimately written to the media 310. The uniform-sized modulation-encoded data may then be provided to the OC encoder 306, which may generate OC parity sectors having an equal size to the modulation-encoded host sectors. Accordingly, all sectors of an OC block may be a uniform size.

OC parity sectors and modulation-encoded host sectors that are to be written to the target track A, or to another location associated with the same modulation code as track A, may then be IC encoded and recorded to the media 310. For a sector that is to be written to a different track B associated with a different modulation code, however, dummy or padding bits may be appended to the sector in order to make the size of the padded sector equal to a target length L. The length L may be a bit length such that, when the L-length sector is fully encoded, the sector length will equal a multiple of the media sector size of track B. Depending on the type of sector being stored to track B (e.g. whether host or standard OC parity sectors, or ISP sectors) or the specific encoding implementation when storing data to track B, the target length L may be different. Device firmware may append the padding bits, and track the number of padding bits added and to which sectors, so that the proper amount of padding bits can be removed when a padded sector is read from the media. Hardware components may also be configured to add the padding bits, such as at a hardware-based IC encoder 308.

In an example embodiment, length L may be a multiple of the sector size of track B (less additional bits from IC encoding), so that the padded sector may be the correct length to be stored to some number of media sectors on track B. Alternately, if the padded sector will be encoded with a modulation code for track B, length L may correspond to an expected sector input length of the modulation code for track B. For example, zones designated for storing host data sectors may having modulation codes configured to receive a uniform host sector size as input (e.g. 512 bytes). However, an area of the media 310 may be a media cache reserved for storing ISP sectors, and may have an associated modulation code configured to receive input sectors of a different size. For example, the media cache modulation code input size may correspond to a largest modulation-encoded sector size from the host sector zones. An ISP sector corresponding to certain host data zones may be padded in order to be equal in length to the input length of the modulation code used on the new track in the media cache zone where it will be written. For example, an ISP sector may be padded to be equal in length to the largest modulation-encoded sector size from host data zones. Padded ISP sectors may first be modulated by the modulation code for the new track, and then IC encoded and written to the new track in the media cache zone.

In an example embodiment, a DSD may include a hard disc media 310 having three zones, each associated with a different modulation code. The media sector size of each zone may be based on the size of a modulation-encoded sector. Zone A may be associated with modulation code A, and have media sectors of 540 bytes in length. Zone C may be associated with modulation code C and have media sectors of 580 bytes in length. The host 102 may issue a write request to store host data to LBAs 1-10. The DSD may consult an address mapping table and determine that LBAs 1-10 correspond to a full track of media sectors located in zone A. However, the media sector corresponding to LBA 7 may include a defect making writes to the sector unreliable. The address map may therefore indicate that LBA 7 has been reallocated to a spare sector in Zone C. The host data for LBAs 1-10 may be provided to the modulation encoder 304 with an indication to apply modulation code A. The modulation encoded sectors may all have the same length of 540 bytes, and may be provided to the OC encoder 306, which may produce OC parity sectors having the same length as the modulation-encoded data sectors. The modulation-encoded data sectors and the OC parity sectors may then be provided to the IC encoder 308. The data for LBAs 1-6 and 8-10, as well as the OC parity sectors, may be encoded by the IC encoder 308, producing data sectors of 540 bytes and stored to the media 310 in zone A. The data for the reallocated LBA 7 may be padded with 40 bytes of dummy data to make the data 580 bytes in length. The combined modulation-encoded host data and dummy data may be encoded by the IC encoder 308, producing a data sector of 580 bytes, and then stored to the spare sector in zone C. In actual implementation the final media sector size in each zone may include parity bits produced by the IC encoding process, but for the sake of simplicity the example sector lengths disregard size modification from IC encoding.

As discussed herein, sectors may be associated with a modulation code of a different area from that in which they are stored for a number of reasons. Reallocated sectors are an example, as well as intermediate super parity (ISP) sectors. An ISP sector may be an OC parity sector generated as a temporary parity sector for randomly written data. In an example where an OC parity block corresponds to a full data track, standard OC parity sectors may be generated and stored to the target track along with the other written data when a write request includes fully writing a track. However, at times a subset of a track may be written or updated. Rather than reading the whole data track including the newly written sectors to produce new OC parity sectors for the whole track, the DSD may instead generate ISP sectors for the subset of newly written sectors.

When a host 302 requests a random write of some number N of user sectors less than a track, a set of ISP sectors for these N user sectors may be computed and stored in DRAM. When the user sectors are stored to the track, the previously-recorded OC parity sectors that are stored on the media at the end of the track may become invalid. The DSD may have to rely on the ISP sectors to perform OC recovery on the newly-written sectors, and OC recovery may become unavailable for previously-written sectors on the track until the OC parity sectors for the track are updated based on all sectors of the track, including both the old and new sectors. Due to space limitations in the DRAM and to protect against potential data loss in volatile memory, after a certain number of random writes the ISP sectors computed for the writes may be written as user sectors in a nonvolatile media cache region of the drive. By storing the ISP sectors as user data sectors to a track or other OC block, OC parity sectors may be computed and stored for the OC block including the ISP sectors, allowing for OC recovery of the ISP sectors. However, performing OC recovery of N user sectors using the ISP sectors may require that the ISP sectors be the same size as the random write user sectors recorded to the target track. Therefore if the modulation code associated with the media cache is different than the modulation code associated with the target location of the host sectors of the OC block, the ISP sectors may need to be padded with dummy data so as to be a multiple of the sector sizes of the media cache.

Areas of the media 310 to which sectors associated with a different area and modulation code may be written may have sector sizes selected to accommodate the described sector management process. For example, zones including spare sectors and media cache regions may be associated with a modulation code that produces the largest media sectors. In this manner, any sectors associated with different modulation codes can have some number of padding bits added to fill the media sector size of the spare sector or media cache. In another example, zones including spare sectors or media cache regions may have smaller sector sizes than other zones, and sectors associated with other areas may be stored to some multiple of the sector size. For example, a media cache sector may have a size of 128 bytes. If a sector having a size of 380 bytes is to be stored to the media cache, the sector can be stored to three media cache sectors (3*128=384 bytes), with 4 bytes of dummy data appended to fill the three media cache sectors. More detailed examples of padding sectors associated with different modulation codes are provided in regard to the following figures.

Figure 4:
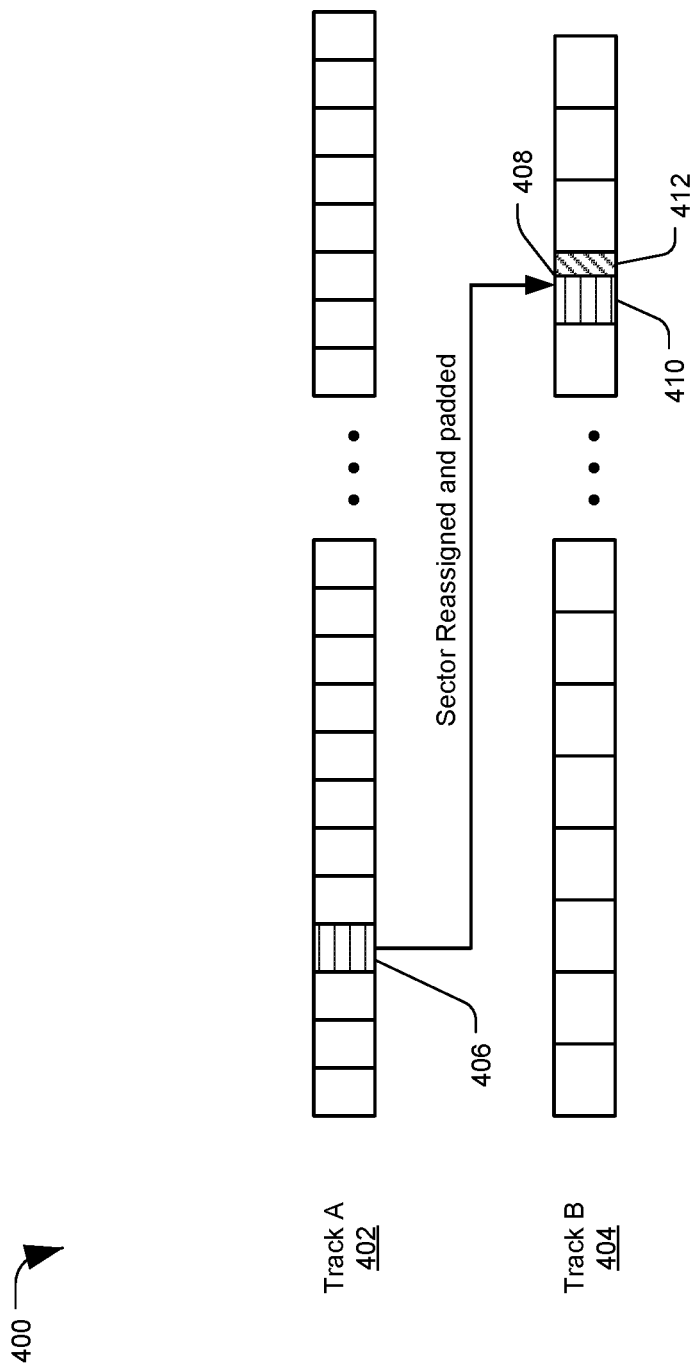
FIG. 4 is a diagram of a system configured to implement sector management in drives having multiple modulation coding, in accordance with certain embodiments of the present disclosure.

FIG. 4 is a diagram of a system configured to implement sector management in drives having multiple modulation coding, in accordance with certain embodiments of the present disclosure. In particular, FIG. 4 depicts an example set of tracks 400 of a data storage medium, such as a magnetic disc, with each track each including a plurality data sectors.

In storage mediums, defective sectors may be reassigned or reallocated from a first track to a second track. For the majority of a storage medium, consecutive sectors may be assigned consecutive LBAs, such that a range of consecutive LBAs may be read or written during a single traversal of a track by a transducer head. Other portions of a storage medium may be reserved as spare sectors that are not initially assigned LBAs. When a bad sector is located (e.g. a sector to which reads or writes have a high likelihood of failure), the LBA for that sector may be reassigned to one of the spare sectors. Accordingly, sectors in a spare region may not have consecutive LBAs, but instead spare regions may have a collection of noncontiguous LBAs reassigned from various locations of the storage medium. Similarly, bad sectors in a contiguous area of the storage medium may result in discontinuities in the LBAs (e.g. LBAs 98, 99, 100, [bad sector], 102 . . . ).

In the depicted embodiment, track A 402 may be a track of contiguous LBAs, while track B 404 may include spare sectors to which bad sectors may be reassigned. Track A 402 may include a bad sector 406, which has been reassigned to sector 408 of track B 404. However, track A 402 and track B 404 may have different associated modulation codes, and therefore the media sector sizes for the two tracks may be different. In the depicted embodiment, the sectors of track B 404 may be larger (e.g. a longer bit length) than sectors on track A 402.

As discussed herein, sectors from the same OC block may need to be uniform in length to perform OC or IOC error correction. In addition, the OC parity that is computed on the original OC block must remain valid. Hence, data that is reallocated to a different track should be kept the same as the data that was used to compute the OC parity sectors for the initial target track or OC block. Even though an LBA was reassigned from sector 406 to sector 408, the data stored to sector 408 of track B 404 may still be part of an OC parity block with the other sectors on track A 402, and therefore may need to be the same size as those sectors. In order to maintain the same sector length for reassigned sectors while maintaining their data content, bit padding may be used. All the sectors intended to be written to the target track A 402, including the reassigned sector 406, may be modulation encoded with a corresponding modulation code A. The sectors for track A 402 may then undergo OC encoding to generate OC parity sectors for track A 402. The non-reassigned sectors, including the OC parity sectors, may be encoded with IC encoding and stored to track A. The data for the reassigned sector 406, however, may have dummy data appended prior to being stored to the spare sector 408, in order to have the bit length of the reassigned data match the sector length for track B 404. Accordingly, the reassigned sector 408 may include valid host data 410, and dummy data 412. The combined host data 410 and dummy data 412 may be encoded with IC encoding and recorded to track B 404. A determination may be made that a sector is reassigned, and that dummy data is to be appended, either before or after the sector is modulation-encoded.

The amount of padding bits may be based on a difference between the modulation-encoded data lengths of sectors from tracks A 402 and B 404. Optionally, the bit padding length may be based on some multiple number of sectors (e.g. if multiple sectors from track A 402 may be stored to a single sector of track B 404, or multiple sectors of track B 404 may be used to store the a single sector from track A 402). The sector size of media zones having spare sectors may be selected based on sector reassignment and padding. For example, the sector size for track B 404 may be selected to be the same size or larger than the sectors in all other media zones used for storing host data. In this manner, sectors from any other zone may be stored to a spare sector as long as an appropriate amount of padding bits are added.

The DSD may store information on the amount of padding bits applied for each sector, so that the padding bits can be removed prior to performing OC recovery. For example, the DSD may maintain a mapping table or reassigned sector table that identifies which sectors have been reassigned, and includes identifiers for the modulation encoding scheme applied, or a recording zone from which the sector was reassigned. The mapping table or another lookup table (LUT) may identify the amount of padding bits that would be applied for each modulation code. For example, if the DSD includes three modulation encoding schemes (A, B, and C), all sectors associated with modulation code A may have 40 padding bits applied, sectors associated with modulation code B may have 20 padding bits applied, and sectors associated with modulation code C may have 0 padding bits applied.

When a read operation is performed that includes a reassigned sector, the sector may be read, IC decoding performed, and the identified number of padding bits may be removed or ignored. The read data less the padded bits may then be provided to the OC decoder, which may update the syndrome state for the OC block. Likewise, the read data less the padded bits may be modulation decoded and returned to a host issuing the read request. Methods for writing and reading reassigned sectors are described below.

Figure 5:
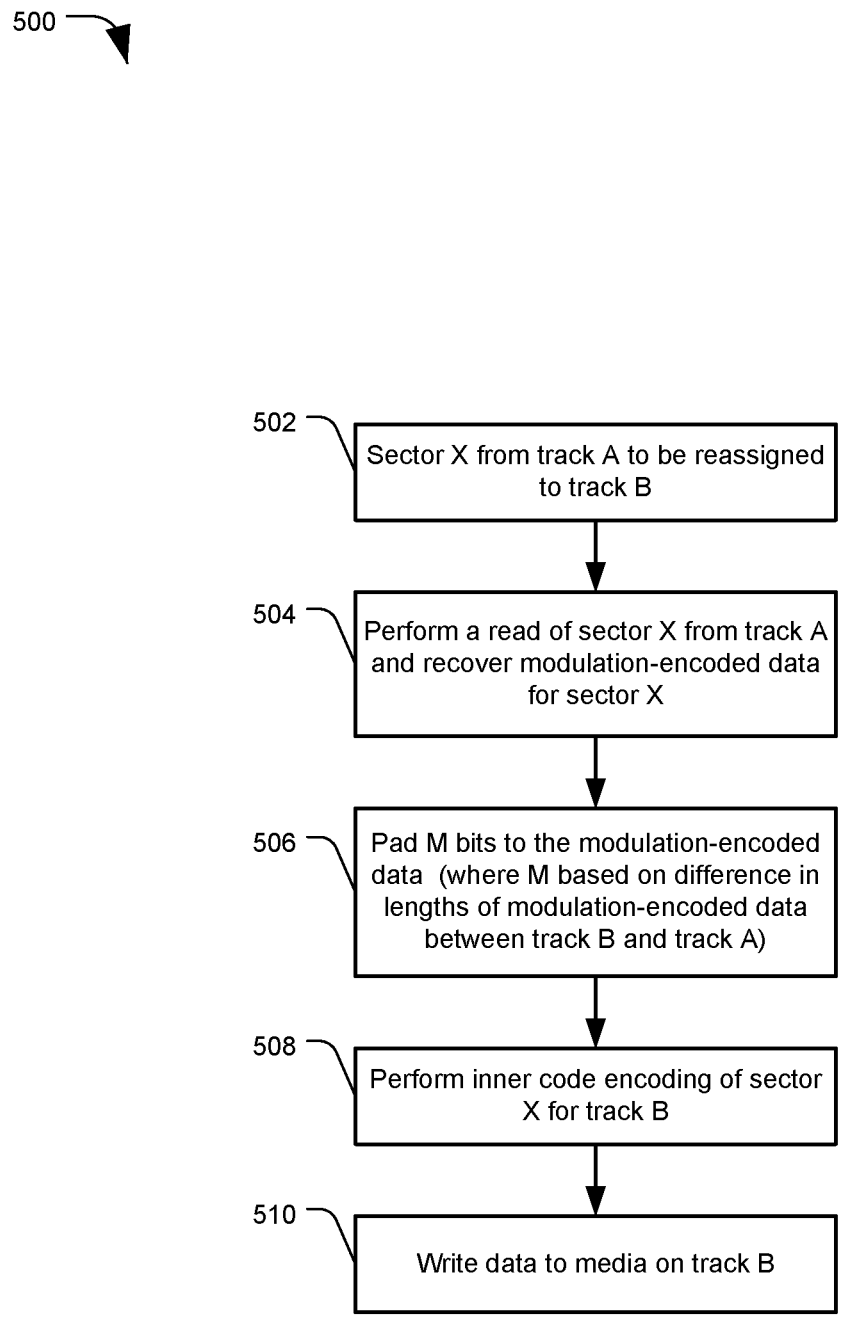
FIG. 5 is a flowchart of a method of implementing sector management in drives having multiple modulation coding, in accordance with certain embodiments of the present disclosure.

FIG. 5 is a flowchart of an example method 500 of sector management in drives having multiple modulation coding, in accordance with certain embodiments of the present disclosure. In particular, the method 500 may describe a process for reallocating a sector in a device having different modulation codes for different storage locations. The method 500 may be performed by one or more components of a data storage device (DSD), such as a coding management module (CMM).

The method 500 may include determining that sector X should be reassigned from track A, which is associated with a first modulation code, to track B, which is associated with a second, different modulation code, at 502. A DSD may elect to reassign a sector to a new location when one or more errors have been encountered when reading or writing to the sector. The DSD may have one or more areas of the storage medium reserved for spare sectors to account for bad sectors arising during device operation, and these spare areas may be associated with a different modulation code than the original sector that is being reassigned.

At 504, the method 500 may include performing a read of sector X from track A and performing IC decoding to recover the modulation-encoded data for sector X. The method 500 may include padding M bits to the modulation-encoded data for sector X, at 506. The number of bits M may be based on a difference in lengths of modulation-encoded data between track B and track A. For example, if modulation-encoded data for track B is 600 bytes, and modulation-encoded data for track A is 500 bytes, the method 500 may include padding 100 bytes of dummy data onto the modulation-encoded data of sector X.

The padded data of sector X may be encoded with an IC encoding scheme corresponding to track B, at 508. Performing IC encoding may alter the final size of the sector recorded to the media, such as by increasing it from 600 bytes to 700 bytes. The IC-encoded sector may then be written to the media in a spare sector of track B, at 510. An example method of reading a reallocated sector is discussed in regard to FIG. 6.

Figure 6:
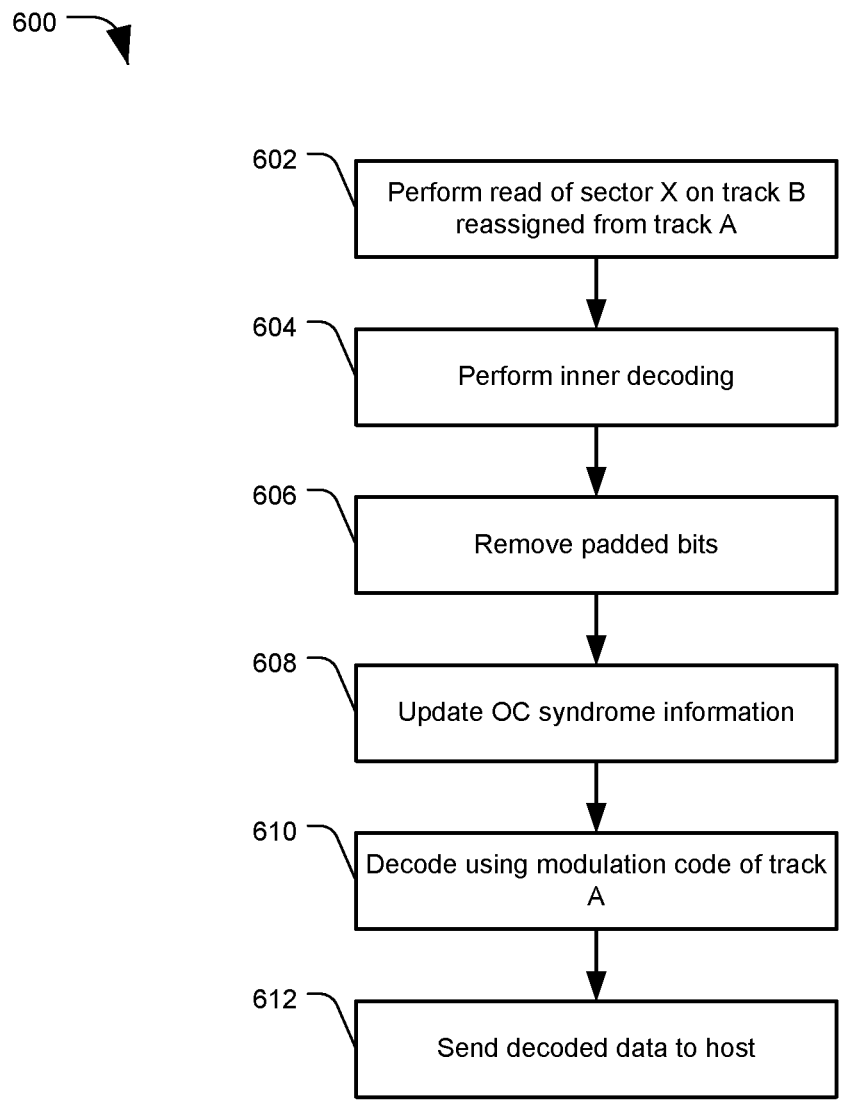
FIG. 6 is a flowchart of a method of implementing sector management in drives having multiple modulation coding, in accordance with certain embodiments of the present disclosure.

FIG. 6 is a flowchart of an example method 600 of sector management in drives having multiple modulation coding, in accordance with certain embodiments of the present disclosure. The method 500 may be performed by one or more components of a data storage device (DSD), such as a coding management module (CMM).

The method 600 may include performing a read operation for sector X on track B, after sector X had been reassigned from track A, at 602. The read may be performed in response to receiving a host read request that requests an LBA range including sector X. A copy of the read data may be loaded to a temporary memory for processing. IC decoding may be performed on the read data, at 604. At 606, the method 600 may include removing the padded bits that were added to the data when sector X was reassigned to track B. The DSD may consult a mapping table or other LUT to determine the number of bits to remove. After the padding bits are removed, the modulation-encoded data for sector X is left, encoded with the modulation code associated with track A.

The modulation-encoded data may be provided to an OC decoder, which may update OC syndrome information for the OC parity block with which sector X is associated, at 608. If any OC- or IOC-based error recovery is required to recover sectors from the OC block, it may be performed once the syndrome state for the OC block has been fully updated based on successfully read sectors.

After or in parallel to the syndrome update at 608, the method 600 may providing the modulation-encoded data to a modulation decoder, at 610. The modulation decoder may decode the sector X data using the modulation code associated with track A. The modulation-decoded data may then be sent to the host, at 612. Sector and coding management may also be performed for intermediate parity sectors in addition to reallocated sectors. A diagram of sector management for ISP sectors will now be discussed in regard to FIG. 7.

Figure 7:
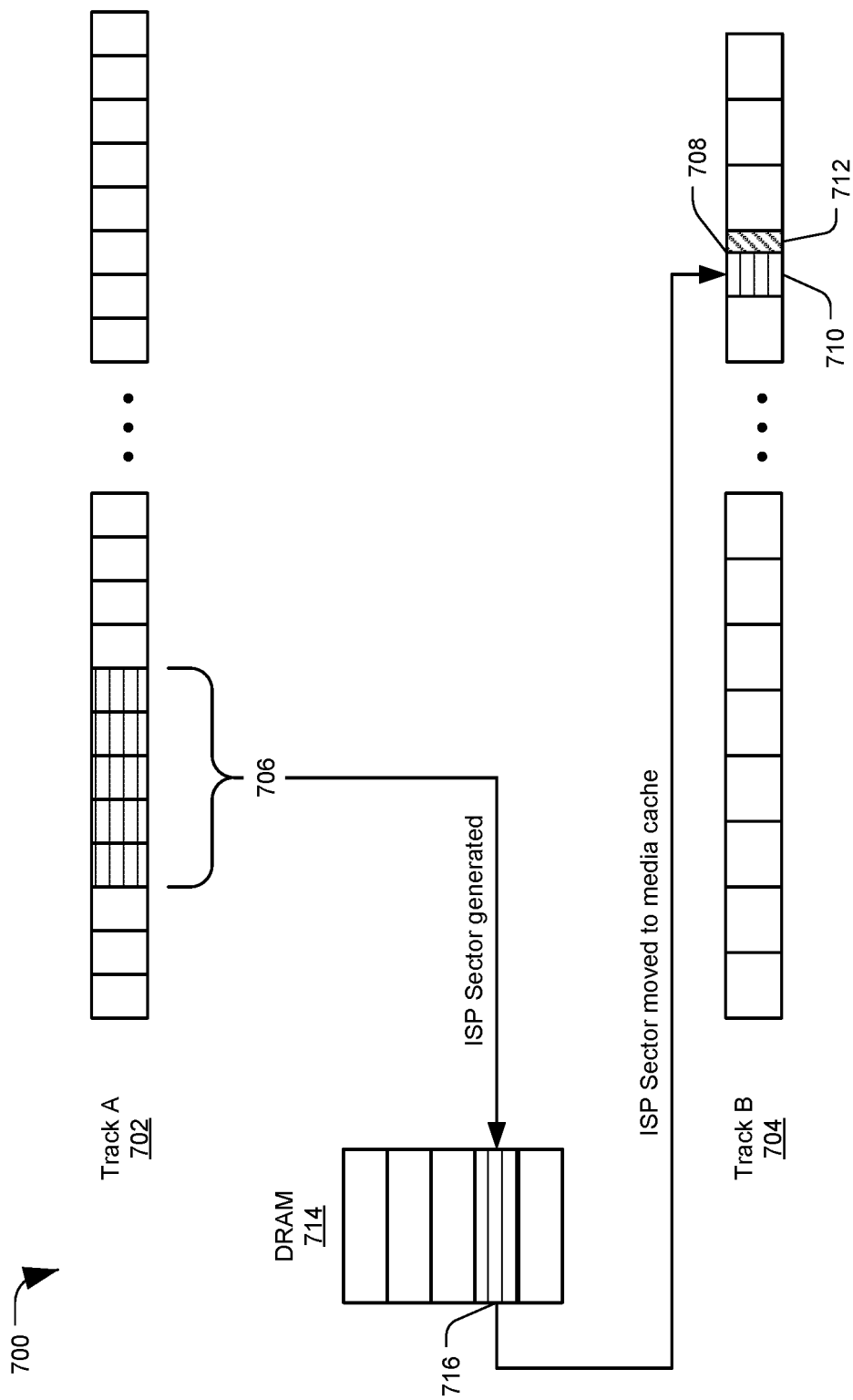
FIG. 7 is a diagram of a system configured to implement sector management in drives having multiple modulation coding, in accordance with certain embodiments of the present disclosure.

FIG. 7 is a diagram of a system configured to implement sector management in drives having multiple modulation coding, in accordance with certain embodiments of the present disclosure. In particular, FIG. 7 depicts an example set of storage media locations 700 of a data storage device (DSD). The locations 700 may include two data tracks, track A 702 and track B 704, each associated with a different modulation code. The locations 700 may also include a dynamic random access memory (DRAM) 714, or a similar temporary or working memory.

A host may issue a random write command directed to a sequence of LBAs 706, which may be encoded with a first modulation encoding scheme and stored to track A 702. In the depicted example, the sequence of LBAs 706 may not span a full OC block, such as the entire track A 702. Accordingly, OC parity sectors already stored to track A 702 may become invalid until all of the host sectors of track A can be read and new OC parity sectors are generated and stored. However, the DSD may generate one or more temporary OC parity sectors for the sequence of LBAs 706, in order to provide a method of performing OC error correction for those sectors until OC parity sectors for all of track A 702 can be generated (e.g. when the DSD is idle). This temporary parity sector may be referred to as an intermediate super parity (ISP) sector 716. The ISP sector 716 may be generated based on the modulation-encoded sectors of LBAs 706, and may therefore be the same size as the modulation-encoded sectors 706.

The ISP sector 716 may be stored to DRAM 714, where it may be retrieved if OC error correction is to be performed on the sequence of LBAs 706. However, DRAM 714 space may be limited, and if full OC parity sectors for track A 702 have not been generated by the time more space is needed in DRAM 714 (e.g. after a certain number of random writes are performed and corresponding ISP sectors generated), the ISP sector 716 may be removed from the DRAM 714 and stored to a sector 708 in a media cache region of the storage media, e.g. on a track B 704.

A media cache may be a region of a storage media reserved for temporary data storage. For example, the media cache may be used for as an overflow area for DRAM storage, for organizing and sorting large amounts of data that may not fit in DRAM, or for protecting data against power loss to which the volatile DRAM memory is susceptible. The media sectors in the media cache may not have set associations with particular LBAs. The media cache region, including track B 704, may have a different modulation code associated with it than some of the host storage areas, such as an area including track A 702. In the depicted embodiment, the media sectors of track B 704 may be larger than the sectors of track A 702. Therefore the ISP sector 716 may not fill the sector 708 on track B 704. In order to address this, the ISP sector 716 may be padded to a desired length L, so that the data stored to sector 708 includes the ISP sector data 710 and padding data 712. The DSD (e.g. via firmware) may keep track of a number of padding bits 712 added to the ISP data 710. The padding bits 712 may optionally be added to the ISP sector data 710 prior to storage to DRAM 714, or after storage to DRAM 714 and prior to storage to the sector 708 on track B 704.

The length L to which the ISP sector 716 may be padded can be different based on the specific implementation. In a first example, the length L may be the length of a modulation-coded sector produced by the modulation code for track B 704. The combined ISP sector data 710 and padding data 712 may be IC-encoded and stored to track B 704. In this implementation, the ISP sector 716 has not been modulation-encoded and may therefore be more difficult for the DSD to read. Accordingly, the media cache zone (or a sub-zone of the media cache where ISP sectors may be written) may optionally be configured to have a relaxed or lowered bits per inch (BPI) recording density to make the data easier to read.

In a second example, the length L may be based on a data input length for the modulation code for track B 704. For example, track B 704 may be associated with a modulation code that takes a sector input corresponding to the longest modulation-coded sector length for host data storage areas. If a host sector as received at the DSD is 512 bytes, then performing modulation code A on a host sector may produce a 540 byte sector, modulation code B may produce a 560 byte sector, and modulation code C may produce a 580 byte sector, each with a matching ISP sector size. The media cache modulation code may therefore expect a 580 byte input corresponding to the largest modulation-coded host sector size, and produce a 600 byte media sector size. An ISP sector for host sectors encoded with modulation code A may be padded from 540 bytes to 580 bytes to undergo media cache modulation coding, while ISP sectors for host sectors encoded with modulation code C may not need further padding from their 580-byte length. The media cache modulation-coded data may then undergo IC encoding (e.g. increasing the final media cache sector size from 600 to 700) and stored to a media cache sector 708. Modulation-encoding the ISP sectors may make them easier for the drive to read, but may interfere with IOC error recovery if an ISP sector fails to read. To address this, the DSD may treat a modulation-encoded ISP sector that fails to read as an erased or missing sector from the OC parity block, and may attempt to recover it using the other sectors in the block rather than by performing IOC on the ISP sector itself. Treating the ISP sector as a missing sector may reduce the total number of bad sectors that may be recovered by the IOC algorithm, but may prevent error propagation due to performing IOC on a modulation-encoded sector.

Reading the ISP sector from the track B sector 708, for example to perform OC or IOC recovery on the range of LBAs 706, may include reading the IC-encoded sector 708. The IC-encoded sector 708 may be decoded. Optionally, if the padded ISP 716 had been modulation-coded for track B 704, the sector may be modulation-decoded. Decoding the sector (via IC decoding and optionally modulation decoding) may produce the ISP data 710 and padding bits 712. The DSD may determine the number of padding bits 712 to remove as described in regard to FIGS. 4-6. The remaining ISP data 710 may be used to update a syndrome state for performing OC recovery on the range of LBAs 706. Methods describing example operations regarding ISP sectors are described in regards to FIGS. 8 and 9.

Figure 8:
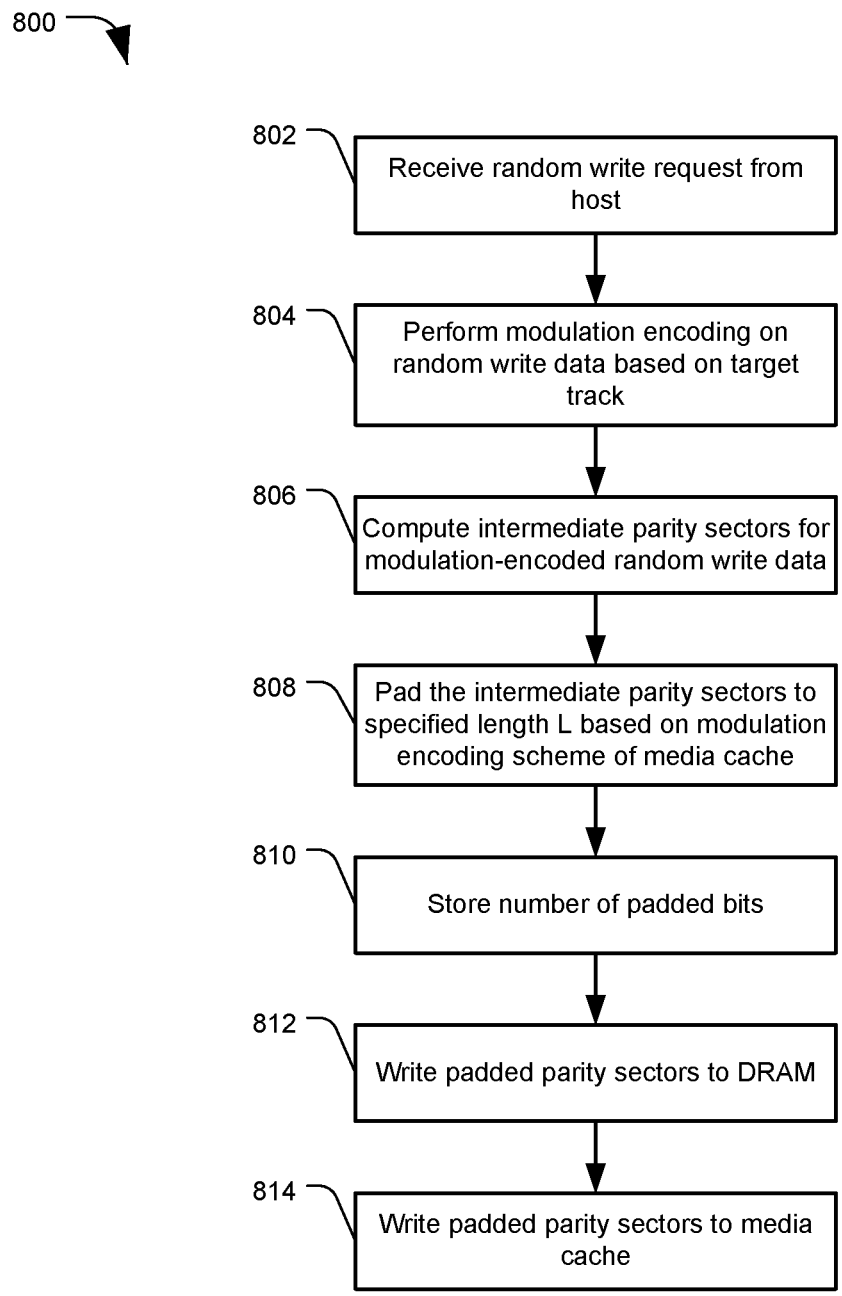
FIG. 8 is a flowchart of a method of implementing sector management in drives having multiple modulation coding, in accordance with certain embodiments of the present disclosure.

FIG. 8 is a flowchart of an example method 800 of sector management in drives having multiple modulation coding, in accordance with certain embodiments of the present disclosure. In particular, the method 800 may describe a process for generating and storing temporary or intermediate OC parity sectors (e.g. ISP sectors) to a region associated with a different modulation code than the associated OC parity block. The method 800 may be performed by one or more components of a data storage device (DSD), such as a coding management module (CMM).

The method 800 may include receiving a random write request from a host device, at 802. The random write request may be for a range of LBAs less than a full OC parity block, for example by updating a subset of sectors within an existing OC parity block. In one embodiment, a parity block may comprise a full data track, and the random write is for a subset of sectors less than a full data track.

The method 800 may include performing modulation coding on the random write data based on the target track for the data, at 804. Intermediate parity sectors may be generated based on the modulation-encoded random write data, rather than for the entire OC parity block, at 806. The intermediate parity sectors may be the same length as a modulation-encoded sector from the random write data.

Each intermediate parity sector may then be padded to a specified length L, at 808. The amount of padding data appended may be based on a difference between the length L and the modulation-coded sector length of a sector from the random write data. The length L may be based on the modulation encoding scheme of the media cache region (or another region having a different modulation code than the target track of the random write data). In an example, the length L may be based on the media sector size of sectors in the media cache (less any additional bits from IC encoding). In another example, the length L may be based on an expected input size for the modulation code of the media cache region. The number of padded bits may be stored, at 810, such as to a mapping table or other LUT.

The padded parity sectors may be stored to DRAM, at 812. At 814, the padded intermediate parity sectors may be written to the media cache. The intermediate parity sectors may be maintained in DRAM until they are relocated, e.g. due to limited DRAM space or to prevent data loss due to power loss. Optionally the intermediate parity sectors may be stored to a media cache region directly without storing them to DRAM first. The intermediate parity sectors may optionally be stored to DRAM, at 812, without padding, and may only be padded prior to storage to a media cache region at 814. Depending on implementation, the padded parity sectors may be encoded with a modulation code corresponding to the media cache prior to storage to the media cache. An example method of retrieving intermediate parity sectors stored to the media cache is described in regard to FIG. 9.

Figure 9:
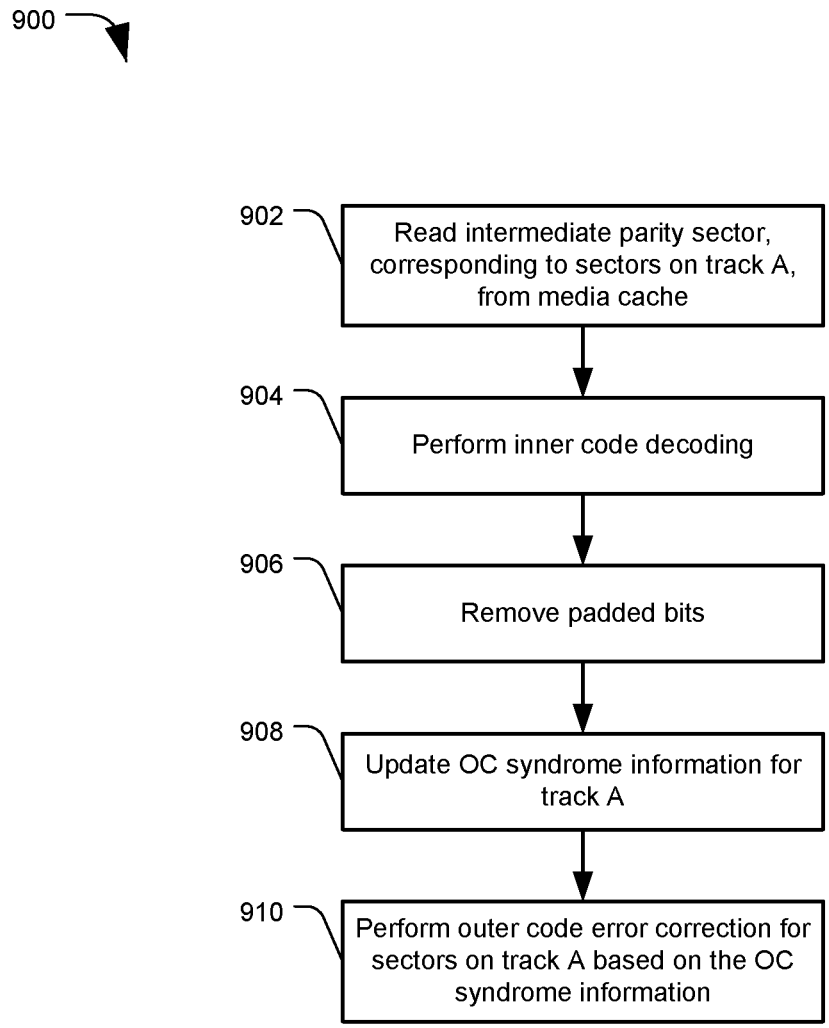
FIG. 9 is a flowchart of a method of implementing sector management in drives having multiple modulation coding, in accordance with certain embodiments of the present disclosure.

FIG. 9 is a flowchart of an example method 900 of sector management in drives having multiple modulation coding, in accordance with certain embodiments of the present disclosure. In particular, the method 900 may describe a process for performing OC error correction using intermediate OC parity sectors (e.g. ISP sectors) stored to a region associated with a different modulation code than the associated OC parity block. The method 900 may be performed by one or more components of a data storage device (DSD), such as a coding management module (CMM).

The method 900 may include reading an intermediate parity sector, corresponding to a set of sectors on track A, from a media cache region (e.g. track B), at 902. For example, one or more host sectors from track A may have failed to converge, and the DSD may read the intermediate parity sectors to attempt to employ OC recovery operations.

The method 900 may include performing inner code (IC) decoding on the intermediate parity sector, at 904. A number of padded bits appended to the intermediate parity sector may be determined and removed, at 906. For example, a number of padding bits may be stored to an address table, or may be determined based on a difference between the modulation-encoded length of sectors on track A and a length L associated with the media cache.

Once the padding bits have been removed, the intermediate parity sector may be used to update the OC syndrome information for the set of sectors on track A, at 908. The method 900 may then include performing OC error correction for the set of sectors on track A based on the OC syndrome information, at 910.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A circuit configured to:
generate a first data sector having a first number of bits based on a first encoding scheme associated with a first physical storage location within a data storage medium;
determine a difference between the first number of bits and a second number of bits corresponding to a second encoding scheme associated with a second physical storage location within the data storage medium;
append a number of padding bits to the first data sector based on the difference, resulting in the first data sector including the first number of bits plus the number of padding bits; and
store the first data sector to the second physical storage location of the data storage medium.

2. The circuit of claim 1 further comprising:
the first encoding scheme is a first modulation code which produces sectors having the first number of bits; and
the second encoding scheme is a second modulation code which produces sectors having the second number of bits different from the first number of bits.

3. The circuit of claim 1 further configured to:
read the first data sector from the second physical storage location;
determine the number of padding bits using a lookup table;
remove the number of padding bits from the first data sector; and
decode the first data sector using a selected encoding scheme.

4. The circuit of claim 3 further comprising:
the first data sector is encoded with the first encoding scheme prior to storage to the second location; and
the selected encoding scheme is the first encoding scheme.

5. The circuit of claim 3 further comprising:
the first data sector is an intermediate parity sector generated from host sectors stored to the first physical storage location and encoded with the second encoding scheme prior to storage to the second physical storage location, wherein the second physical storage location is a media cache configured for storing intermediate parity sectors and the second encoding scheme include an encoding scheme associated with the media cache;
the selected encoding scheme is the second encoding scheme; and
the circuit is configured to decode the first data sector using the second encoding scheme prior to removing the number of padding bits from the first sector.

6. The circuit of claim 1 further comprising:
receive a write request including host data and an associated logical block address (LBA) from a host;
determine the LBA is associated with the first physical storage location and the first encoding scheme;
perform modulation encoding on the host data via a modulation encoder using the first encoding scheme to generate the first data sector having the first number of bits;
determine the LBA is reassigned to a spare sector in the second physical storage location; and
determine the difference and pad the first data sector to store the first data sector to the spare sector.

7. The circuit of claim 6 further configured to:
perform outer code (OC) encoding via an OC encoder to generate a parity sector, having the first number of bits, for modulation-encoded data sectors including:
(1) the first data sector, and
(2) at least one other data sector having the first number of bits that is to be stored to the first physical storage location;
store the at least one other data sector and the parity sector to the first physical storage location; and
perform OC error correction based on the first data sector, the at least one other data sector, and the parity sector.

8. The circuit of claim 1 further configured to:
store data to outer code (OC) parity blocks having a selected number of sectors for which OC parity sectors are generated;
receive a write request to store a sequence of logical block addresses (LBAs) including fewer than the selected number of sectors to the first physical storage location; and
the first data sector is an intermediate parity sector for the sequence of LBAs, the intermediate parity sector being a temporary parity sector for fewer sectors than an OC parity block and having the first number of bits prior to appending the number of padding bits.

9. The circuit of claim 8 further configured to:
perform modulation encoding on the sequence of LBAs using the first encoding scheme to generate modulation-encoded host sectors having the first number of bits, wherein the circuit
generates the first data sector by performing OC encoding on the modulation-encoded host sectors; and
wherein the second physical storage location includes a media cache configured to store the intermediate parity sector and the second encoding scheme includes a modulation code associated with the media cache.

10. The circuit of claim 9 further configured to:
perform a read operation in response to a read request from a host, including:
read the sequence of LBAs from the first location;
read the first data sector from the second location;
determine the number of padding bits;
remove the number of padding bits;
perform OC decoding using the sequence of LBAs and the first data sector;
decode the sequence of LBAs using the first encoding scheme to produce decoded host data; and
return the decoded host data to the host.

11. A method comprising:
generating a first data sector having a first number of bits based on a first encoding scheme associated with a first location of a data storage medium, the first encoding scheme is a first modulation code which produces sectors having the first number of bits;
determining a difference between the first number of bits and a second number of bits corresponding to a second encoding scheme associated with a second location of the data storage medium;
appending a number of padding bits to the first data sector based on the difference, resulting in the first data sector including the first number of bits plus the number of padding bits; and storing the first data sector to the second location of the data storage medium.

12. The method of claim 11 further comprising:
the first data sector includes host data received from a host and associated with a logical block address (LBA) that has been reassigned from the first location to a spare sector in the second location, wherein the first data sector having the first number of bits is generated by performing modulation encoding on the host data using the first encoding scheme;
after storing the first data sector to the spare sector in the second location, reading the first data sector from the second location;
determining the number of padding bits using a lookup table;
removing the number of padding bits from the first data sector; and
decoding the first data sector using the first encoding scheme.

13. The method of claim 12 further comprising:
performing outer code (OC) encoding via an OC encoder to generate a parity sector, having the first number of bits, for modulation-encoded data sectors including:
(1) the first data sector, and
(2) at least one other data sector having the first number of bits that is to be stored to the first location;
storing the at least one other data sector and the parity sector to the first location; and
performing OC error correction based on the first data sector, the at least one other data sector, and the parity sector.

14. The method of claim 12 further comprising:
storing data to outer code (OC) parity blocks having a selected number of sectors for which OC parity sectors are generated;
receiving a write request to store a sequence of logical block addresses (LBAs) including fewer than the selected number of sectors to the first location; and
generating an intermediate parity sector for the sequence of LBAs, the intermediate parity sector being a temporary parity sector calculated for fewer sectors than an OC parity block.

15. The method of claim 14 further comprising:
performing modulation encoding on the sequence of LBAs using the first encoding scheme to generate modulation-encoded host sectors having the first number of bits;
performing OC encoding on the modulation-encoded host sectors to generate the intermediate parity sector having the first number of bits;
determining a second difference between the first number of bits and a third number of bits corresponding to a third encoding scheme associated with a third location of the data storage medium;
append padding bits to the intermediate parity sector based on the second difference, wherein the third location includes a media cache configured to store the intermediate parity sector and the third encoding scheme includes a modulation code associated with the media cache; and
store the intermediate parity sector to the media cache.

16. An apparatus comprising:
a channel circuit configured to:
generate a first data sector having a first number of bits based on a first encoding scheme associated with a first location of a data storage medium;
determine a difference between the first number of bits and a second number of bits corresponding to a second encoding scheme associated with a second location of the data storage medium;
append a number of padding bits to the first data sector based on the difference, resulting in the first data sector including the first number of bits plus the number of padding bits; and
store the first data sector to the second location of the data storage medium.

17. The apparatus of claim 16 comprising the channel circuit further configured to:
store data to outer code (OC) parity blocks having a selected number of sectors for which OC parity sectors are generated;
receive a write request to store a sequence of logical block addresses (LBAs) including fewer than the selected number of sectors to the first location; and
the first data sector is an intermediate parity sector for the sequence of LBAs, the intermediate parity sector being a temporary parity sector for fewer sectors than an OC parity block and having the first number of bits prior to appending the number of padding bits.

18. The apparatus of claim 17 comprising the channel circuit further configured to:
perform modulation encoding on the sequence of LBAs using the first encoding scheme to generate modulation-encoded host sectors having the first number of bits, wherein the circuit generates the first data sector by performing OC encoding on the modulation-encoded host sectors;
wherein the second location includes a media cache configured to store the intermediate parity sector and the second encoding scheme includes a modulation code associated with the media cache; and
in response to a read request, perform OC decoding using the sequence of LBAs and the first data sector.

19. The apparatus of claim 18 comprising the channel circuit further configured to:
determine a selected LBA of a selected modulation-encoded host sector is reassigned to a spare sector in a third location of the data storage medium;
determine a second difference between the first number of bits and a third number of bits corresponding to a third modulation encoding scheme associated with the third location; and
store the selected modulation-encoded host sector to the spare sector.

20. The apparatus of claim 19 further comprising:
an interface to communicate with a host device;
the channel circuit including:
a modulation encoder;
an OC encoder;
the data storage medium including the media cache; and
a data storage controller to control data access operations to the data storage medium in response to data access requests from the host device.

* * * * *